(12) United States Patent
Kwon

(10) Patent No.: US 9,448,472 B2
(45) Date of Patent: Sep. 20, 2016

(54) OPTICAL PATTERN TRANSFER MASK AND METHOD OF FABRICATING THE SAME

(71) Applicant: SAMSUNG DISPLAY CO., LTD., Yongin, Gyeonggi-Do (KR)

(72) Inventor: Younggil Kwon, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 18 days.

(21) Appl. No.: 14/640,512

(22) Filed: Mar. 6, 2015

(65) Prior Publication Data

US 2016/0085146 A1   Mar. 24, 2016

(30) Foreign Application Priority Data

Sep. 19, 2014  (KR) .................. 10-2014-0125248

(51) Int. Cl.
| | |
|---|---|
| *B41M 5/40* | (2006.01) |
| *G03F 1/38* | (2012.01) |
| *G03F 1/00* | (2012.01) |
| *B41M 5/44* | (2006.01) |
| *H01L 51/00* | (2006.01) |

(52) U.S. Cl.
CPC .................. *G03F 1/38* (2013.01); *B41M 5/40* (2013.01); *B41M 5/44* (2013.01); *B41M 5/443* (2013.01); *G03F 1/00* (2013.01); *H01L 51/0013* (2013.01)

(58) Field of Classification Search
CPC .............. G03F 1/00; G03F 1/38; G03F 1/50; G03F 1/52; G03F 1/54; G03F 1/58; H01L 51/0013; B41M 5/40; B41M 5/05; B41M 5/42; B41M 5/44; B41M 5/443; B41M 5/48

USPC ....................... 430/5, 199, 200, 201
See application file for complete search history.

(56) References Cited

U.S. PATENT DOCUMENTS

| | | | |
|---|---|---|---|
| 2009/0104835 A1 | 4/2009 | Aoyama et al. | |
| 2009/0197017 A1* | 8/2009 | Tanaka ................ | H01L 51/0013 427/596 |
| 2009/0220706 A1* | 9/2009 | Yamazaki ............... | C23C 14/28 427/596 |
| 2009/0325451 A1 | 12/2009 | Higo et al. | |

(Continued)

FOREIGN PATENT DOCUMENTS

| | | |
|---|---|---|
| JP | 2008-106213 | 5/2008 |
| JP | 2010-34022 | 2/2010 |

(Continued)

OTHER PUBLICATIONS

Coulembier et al., Probe-Based Nanolithography: Self-Amplified Depolymerization Media for Dry Lithography, Macromolecules 2010, 43, Dec. 11, 2009; pp. 572-574.

(Continued)

*Primary Examiner* — John A McPherson
(74) *Attorney, Agent, or Firm* — Lee & Morse, P.C.

(57) ABSTRACT

An optical pattern transfer mask includes a light transmissive substrate, a reflection layer pattern on a plurality of first regions of the light transmissive substrate, a light absorbing layer on the light transmissive substrate and the reflection layer pattern, and a bank layer pattern on the light absorbing layer corresponding to the plurality of first regions of the light transmissive substrate, the bank layer pattern being vertically aligned with the reflection layer pattern. The bank layer pattern includes a Diels-Alder polymer that is polymerizable and depolymerizable by a reversible Diels-Alder reaction.

18 Claims, 6 Drawing Sheets

(56) References Cited

U.S. PATENT DOCUMENTS

| | | | |
|---|---|---|---|
| 2010/0015424 A1* | 1/2010 | Seo | H01L 51/0013 428/216 |
| 2010/0084676 A1 | 4/2010 | Tanaka | |
| 2012/0301672 A1 | 11/2012 | Coady et al. | |

FOREIGN PATENT DOCUMENTS

| | | |
|---|---|---|
| KR | 10-2012-0112585 | 10/2012 |
| KR | 10-2013-0098655 A | 9/2013 |
| WO | WO-2011/125570 A1 | 10/2011 |

OTHER PUBLICATIONS

Gotsmann et al., Exploiting Chemical Switching in a Diels—Alder Polymer for nanoscale Probe Lithography and Data Storage, Adv. Funct. Mater, 2006, 16, pp. 1499-1505.

Knoll et al. Probe-Based 3-D Nanolithograpy Using Self-Amplified Depolymerization Polymers, Adv. Mater, 2010, 22, pp. 3361-3365.

* cited by examiner

OPTICAL PATTERN TRANSFER MASK AND METHOD OF FABRICATING THE SAME

CROSS-REFERENCE TO RELATED APPLICATION

Korean Patent Application No. 10-2014-0125248, filed on Sep. 19, 2014, in the Korean Intellectual Property Office, and entitled: "Optical Pattern Transfer Mask and Method of Fabricating the Same," is incorporated by reference herein in its entirety.

BACKGROUND

1. Field

Embodiments relate to optical pattern transfer masks and methods of fabricating the same, and more particularly, to optical pattern transfer masks including a barrier wall and methods of fabricating the same.

2. Description of the Related Art

Organic light-emitting display apparatuses are display apparatuses including organic light-emitting devices in display regions. An organic light-emitting device includes a pixel electrode and an opposite electrode facing each other. An intermediate layer that includes an emission layer is interposed between the pixel electrode and the opposite electrode.

SUMMARY

Embodiments are directed to an optical pattern transfer mask including a light transmissive substrate, a reflection layer pattern on a plurality of first regions of the light transmissive substrate, a light absorbing layer on the light transmissive substrate and the reflection layer pattern, and a bank layer pattern on the light absorbing layer corresponding to the plurality of first regions of the light transmissive substrate, the bank layer pattern being vertically aligned with the reflection layer pattern. The bank layer pattern includes a Diels-Alder polymer that is polymerizable and depolymerizable by a reversible Diels-Alder reaction.

The Diels-Alder polymer may include a polyphthalaldehyde (PPA) polymer, or a polymer of a bis(maleimide) derivative cross-linked by trioxysilane.

The Diels-Alder polymer may include a polymer represented by Formula 1 or 2 below:

Formula 1

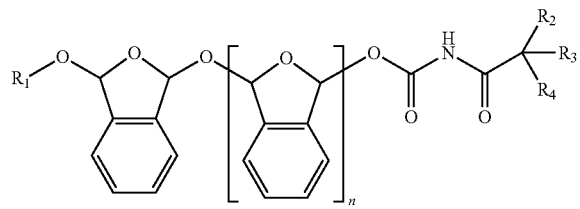

Formula 2

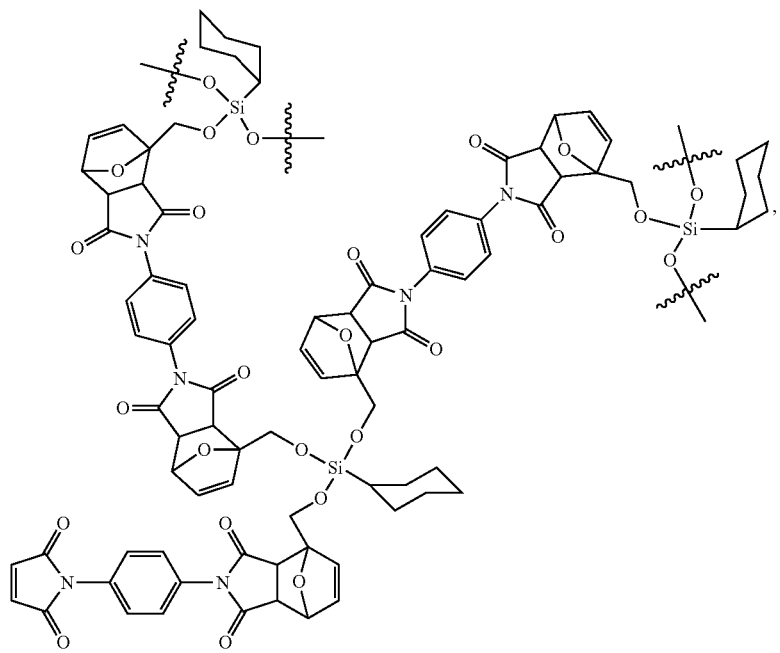

wherein, in Formula 1, $R_1$ is a hydrogen atom, a $C_1$-$C_{10}$ alkyl group, or a $C_6$-$C_{20}$ aryl group, $R_2$ to $R_4$ are each independently a hydrogen atom, a halogen atom, or a $C_1$-$C_{10}$ alkyl group, and n is an integer equal to or greater than 10 and equal to or less than 1,000.

The optical pattern transfer mask may further include a transfer layer on the bank layer pattern.

The optical pattern transfer mask may further include a heat insulation layer between the reflection layer pattern and the light absorbing layer.

Embodiments are also directed to a method of fabricating an optical pattern transfer mask including providing a light transmissive substrate, forming a reflection layer pattern on t a plurality of first regions of the light transmissive substrate, the reflection layer pattern defining openings at second regions between the first regions, forming a light absorbing layer on the light transmissive substrate and the reflection layer pattern, forming a bank layer on the light absorbing layer, the bank layer including a Diels-Alder polymer that is polymerizable and depolymerizable by a reversible Diels-Alder reaction, and removing the Diels-Alder polymer of the bank layer in the second regions via depolymerization by projecting light onto the bottom surface of the light transmissive substrate.

Forming the bank layer may include applying, on the light absorbing layer, a composition in which monomers polymerizable to form the Diels-Alder polymer are mixed, and preparing the Diels-Alder polymer from the monomers via the Diels-Alder reaction by heating the applied composition.

The monomers may include phthalate.

The monomers may include compounds represented by Formulae 2-1 and 2-2 below:

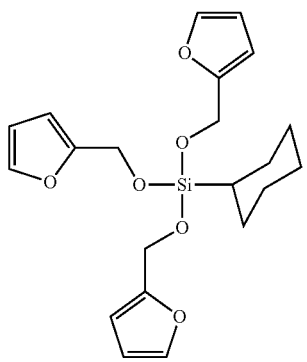

Formula 2-1

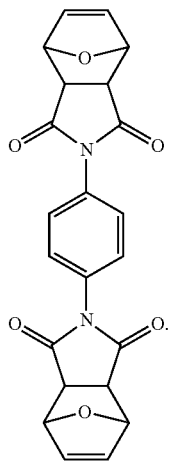

Formula 2-2

The Diels-Alder polymer may include a polyphthalaldehyde (PPA) polymer, or a polymer of a bis(maleimide) derivative cross-linked by trioxysilane.

The Diels-Alder polymer may include a polymer represented by Formula 1 below:

Formula 1 wherein $R_1$ is a hydrogen atom, a $C_1$-$C_{10}$ alkyl group, or a $C_6$-$C_{20}$ aryl group, $R_2$ to $R_4$ are each independently a hydrogen atom, a halogen atom, or a $C_1$-$C_{10}$ alkyl group, and n is an integer equal to or greater than 10 and equal to or less than 1,000.

The Diels-Alder polymer may include a polymer represented by Formula 2 below:

Formula 2

The method may further include forming a transfer layer on the bank layer pattern.

The method may further include forming a heat insulating layer between the reflection layer pattern and the light absorbing layer.

The light absorbing layer may include a metal layer or a stack structure in which metal layers and metal oxide layers are alternately stacked.

The light absorbing layer may absorb the light and convert the light into heat.

The light may be a flash lamp light, laser light, or light-emitting diode (LED) light.

The light may be projected to increase a temperature of the bank layer in the second regions to be greater than a depolymerization temperature of the Diels-Alder polymer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
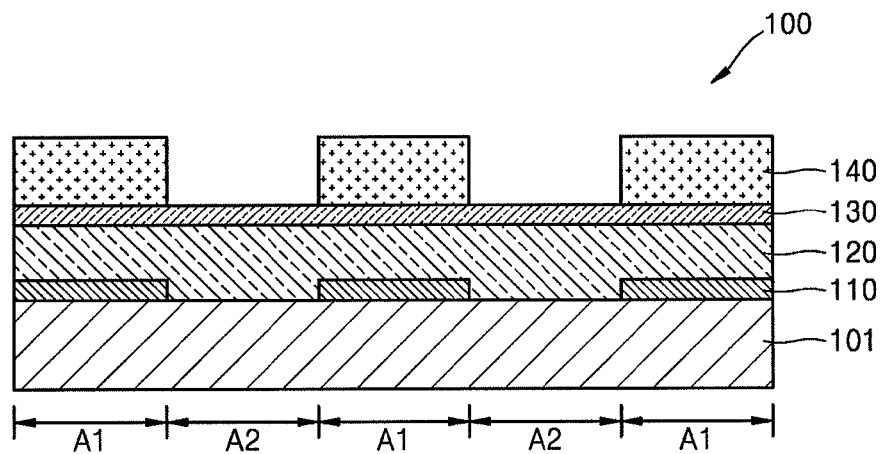
FIG. 1 illustrates a schematic cross-sectional view of an optical pattern transfer mask according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer is referred to as being "on" another layer, it can be directly on the other layer, or intervening layers may also be present. Like reference numerals refer to like elements throughout.

Expressions such as "at least one of," when preceding a list of elements, modify the entire list of elements and do not modify the individual elements of the list.

FIG. 1 illustrates a schematic cross-sectional view of an optical pattern transfer mask 100 according to an exemplary embodiment. The optical pattern transfer mask 100 may include a light transmissive substrate 101, a reflection layer pattern 110, a heat insulation layer 120, a light absorbing layer 130, and a bank layer pattern 140.

The light transmissive substrate 101 may be formed of a suitable light transmittable material. For example, the light transmissive substrate 101 may be formed of a glass material or a heat resistant plastic material. The light transmissive substrate 101 has a plurality of first regions A1 and a plurality of second regions A2. One second region A2 may be formed between every two adjacent first regions A1.

The reflection layer pattern 110 may be disposed on the light transmissive substrate 101 to correspond to the plurality of first regions A1. The reflection layer pattern 110 may reflect light incident on the reflection layer pattern 110. The reflection layer pattern may include a metal having a high reflectance, such as Ag, Al, Pt, Pd, Au, Ni, Nd, or Ir. The reflection layer pattern 110 disposed in the first regions A1 may reflect light incident from the bottom surface of the light transmissive substrate 101. Accordingly, light may not be incident on layers in the first regions A1 beyond the reflection layer pattern 110 in a direction away from the bottom surface of the light transmissive substrate 101, and light may be incident only on such layers in the second regions A2.

The heat insulation layer 120 may be in contact with the light absorbing layer 130 to prevent heat generated by the light absorbing layer 130 after absorbing the light from being transferred to the light transmissive substrate 101 instead being transferred to a transfer layer. Thereby, the heat insulation layer 120 may inhibit heat loss or deterioration of the light transmissive substrate 101. The heat insulation layer 120 may be formed of a material having a lower thermal conductivity than that of the light absorbing layer 130 and having a high light transmittance.

For example, the heat insulation layer 120 may be formed of a heat resistant polymer or an inorganic material. Examples of the heat resistant polymer may include: a high temperature polyimide; a thermosetting heat resistant polymer formed of benzocyclobutene, trifluorovinylether, chlorosilane, or an ethynyl group containing compound; a photocrosslinkable heat resistant polymer formed of an oxetane compound or a cinnamate compound; or an organic siloxane-based heat resistant polymer. The inorganic material may be titanium oxide, silicon oxide, silicon nitroxide, zirconium oxide, silicon carbide, or the like.

The light absorbing layer 130 may be formed on the heat insulation layer 120 to cover the entire surface of the light transmissive substrate 101. The light absorbing layer 130 absorbs light, thereby generating heat such that a transfer layer (e.g., 150 in FIG. 2) formed thereon is transferred to a device substrate. During transferring of the transfer layer, portions of the light absorbing layer 130 corresponding to the first regions A1 are screened by the reflection layer 110 so as not to absorb light and generate heat. On the other hand, other portions of the light absorbing layer 130 corresponding to the second regions A2 are not screened by the reflection layer pattern 110 so as to absorb light and generate heat. Thus, the transfer layer 150 corresponding to the second regions A2 may be transferred onto the device substrate.

The light absorbing layer 130 may have a single-layered structure including carbon or metal, or a multi-layered structure in which metal layers and metal oxide layers are alternately stacked.

When the light absorbing layer 130 includes a metal, the metal may include Mo, Cr, Ti, or W. When the light absorbing layer 130 includes a metal oxide, the metal oxide may include, for example, ITO or $SiO_2$. In some implementations, the light absorbing layer 130 may have a metal/metal oxide/metal stack structure.

The bank layer pattern 140 may be disposed on the light absorbing layer 130 in the first regions A1. The bank layer pattern 140 may serve as a screen to prevent spreading of the transfer layer 150 into other regions when the transfer layer 150 in the second regions A2 is separated from the optical pattern transfer mask by thermal energy and transferred to the device substrate. The transfer may be performed while the optical pattern transfer mask is spaced apart from the device substrate by a predetermined distance. If the bank layer pattern 140 were not present, a material constituting the transfer layer 150 might not be moved vertically but could instead spread in other directions. The bank layer pattern 140 may prevent the spread of the materials constituting the transfer layer 150 in other directions.

The bank layer pattern 140 may be formed of a Diels-Alder polymer that may be polymerized or depolymerized by reversible Diels-Alder reaction. The Diels-Alder polymer according to an exemplary embodiment may be polymerized by a forward Diels-Alder reaction and may be depolymerized by a reverse Diels-Alder reaction.

For example, the Diels-Alder polymer may include a polyphthalaldehyde (PPA) polymer, or a bis(maleimide) derivative polymer cross-linked by trioxysilane.

For example, the Diels-Alder polymer may include a polymer represented by Formula 1 or 2 below.

In Formula 1, $R_1$ is a hydrogen atom, a $C_1$-$C_{10}$ alkyl group, or a $C_6$-$C_{20}$ aryl group, and $R_2$ to $R_4$ are each independently a hydrogen atom, a halogen atom, or a $C_1$-$C_{10}$ alkyl group.

In Formula 1, n may be is an integer equal to or greater than 10 and equal to or less than 1,000.

The polymer represented by Formula 1 and the polymer represented by Formula 2 may have a molecular weight (number average molecular weight) of about 2,000 to about 4,000.

Figure 2:
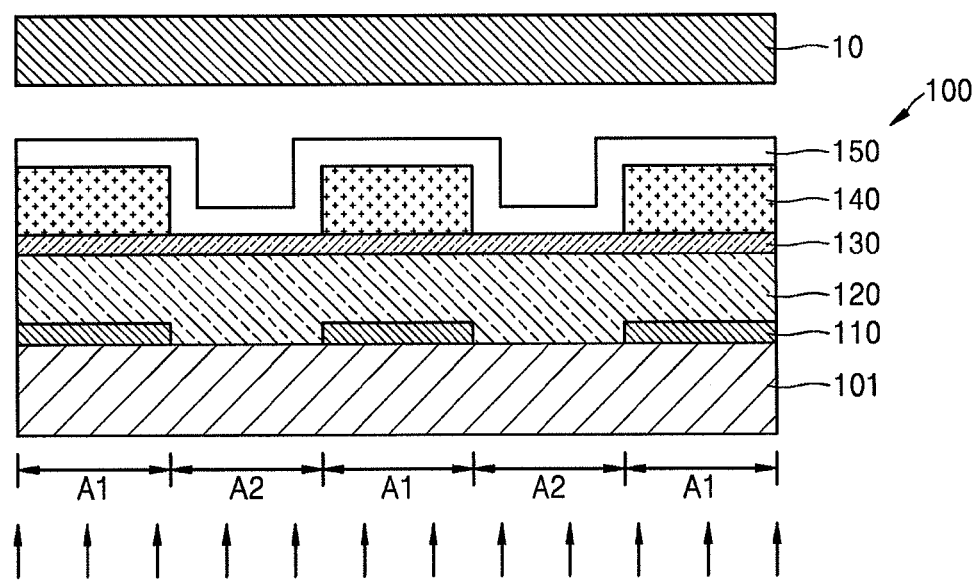
FIGS. 2 and 3 illustrate schematic cross-sectional views illustrating stages of a method of forming a patterned transfer layer on a device substrate by using the optical pattern transfer mask of FIG. 1.

As illustrated in FIG. 2, a transfer layer 150 may be disposed on the light absorbing layer 130 and the bank layer pattern 140 of the optical pattern transfer mask. The transfer layer 150 is a layer including a material to be transferred to a device substrate later. The transfer layer 150 may include an organic material or an inorganic material. For example, the transfer layer 150 may be a buffer layer used to form an emission layer or a resonance structure.

Figure 3:
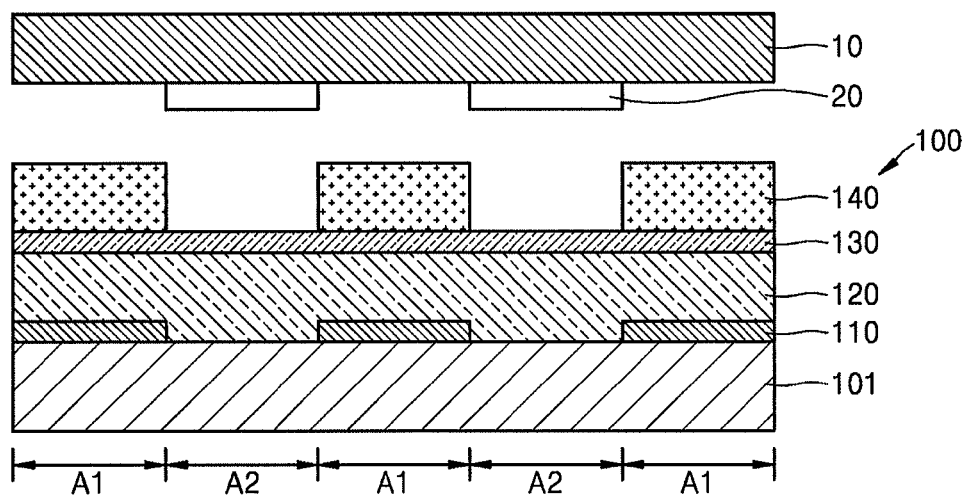

FIGS. 2 and 3 illustrate schematic cross-sectional views of stages of a method of forming a patterned transfer layer on a device substrate 10 by using the optical pattern transfer mask 100 of FIG. 1.

The optical pattern transfer mask 100 and the device substrate 10 onto which the transfer layer 150 is transferred may be aligned as illustrated in FIG. 2. In FIG. 2, the optical pattern transfer mask 100 and the device substrate 10 may be spaced apart from each other at a predetermined distance. In some implementations, the optical pattern transfer mask 100

Formula 1

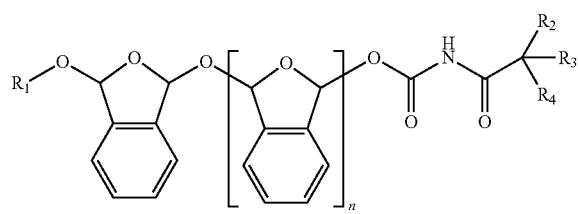

Formula 2

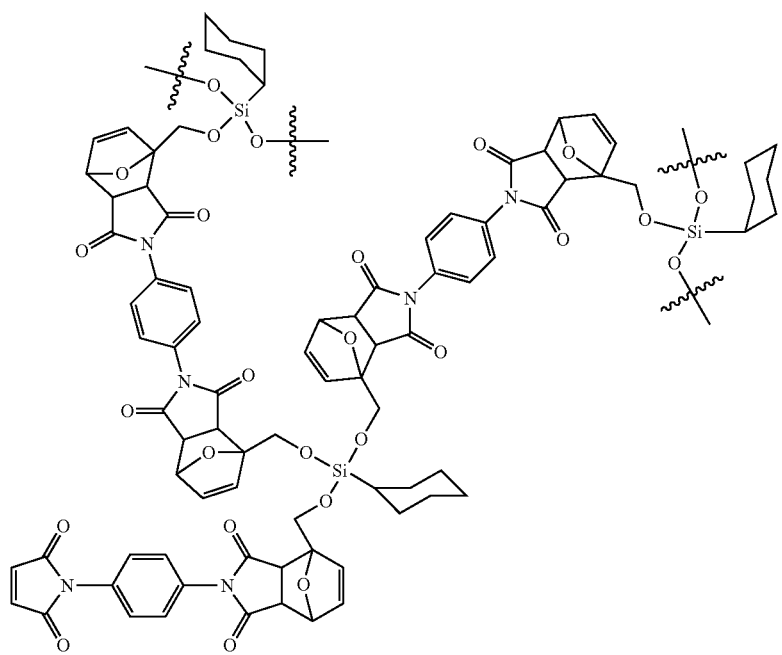

and the device substrate 10 may be aligned to be in a close contact with each other, if desired.

After the alignment, light may be projected onto one surface of the light transmissive substrate 101 of the optical pattern transfer mask 100 opposite to the device substrate 10, as illustrated in FIG. 2. While light projected onto the first regions A1 is reflected by the reflection layer pattern 110 and fails to reach the light absorbing layer 130 in the first regions A1, light projected onto the second regions A2 between the first regions A1 passes through the heat insulation layer 120 to reach the light absorbing layer 130 in the second regions A2. Thus, light may be converted into heat in the light absorbing layer 130 in the second regions A2 between the first regions A1.

Heat generated in the light absorbing layer 130 is transferred to the transfer layer 150. In this regard, heat is not transferred to the entire transfer layer 150. Instead, heat is transferred to portions of the transfer layer 150 corresponding to the second regions A2 between the first regions A1. Heat may not be generated in portions of the light absorbing layer 130 corresponding to the first regions A1 due to the reflection layer pattern 110 disposed in the plurality of the first regions A1. Portions of the transfer layer 150 corresponding to the second regions A2 between the first regions A1 may be transferred to the device substrate 10 as illustrated in FIG. 3, so that a transfer layer pattern 20 may be formed on the device substrate 10.

The transfer layer 150 of the optical pattern transfer mask 100 may be transferred to the device substrate 10 by aligning the optical pattern transfer mask 100 and the device substrate 10 and projecting light onto the back surface of the optical pattern transfer mask 100, thereby forming the transfer layer pattern 20.

The bank layer pattern 140 may serve as a screen to prevent spreading of the transfer layer in directions other than the vertical direction when the transfer layer 150 of the second regions A2 is separated from the optical pattern transfer mask 100 and transferred to the device substrate 10. The bank layer pattern 140 may prevent a material constituting the transfer layer 150 from being transferred to unintended regions on the device substrate 10. Thus, the material may be transferred only to an intended region.

Figure 4:
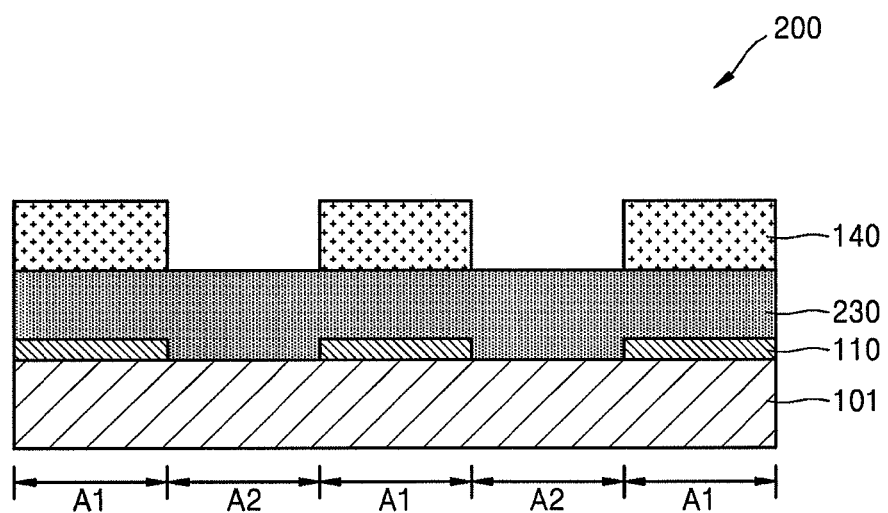
FIG. 4 illustrates a schematic cross-sectional view of an optical pattern transfer mask according to another exemplary embodiment.

FIG. 4 illustrates a schematic cross-sectional view of an optical pattern transfer mask 200 according to another exemplary embodiment.

The optical pattern transfer mask 200 differs from the optical pattern transfer mask 100 described above with reference to FIG. 1, in that the optical pattern transfer mask 200 does not include a heat insulation layer 120.

The heat insulation layer 120 may prevent heat generated by the light absorbing layer 130 from being transferred to the light transmissive substrate 101 instead of to the transfer layer 150. Thereby, the heat insulation layer 120 may inhibit heat loss or deterioration of the light transmissive substrate 101. However, the heat insulation layer 120 may be omitted, and the bank layer pattern 140 may be formed on the light absorbing layer 230 according to the present embodiment.

Figure 5:
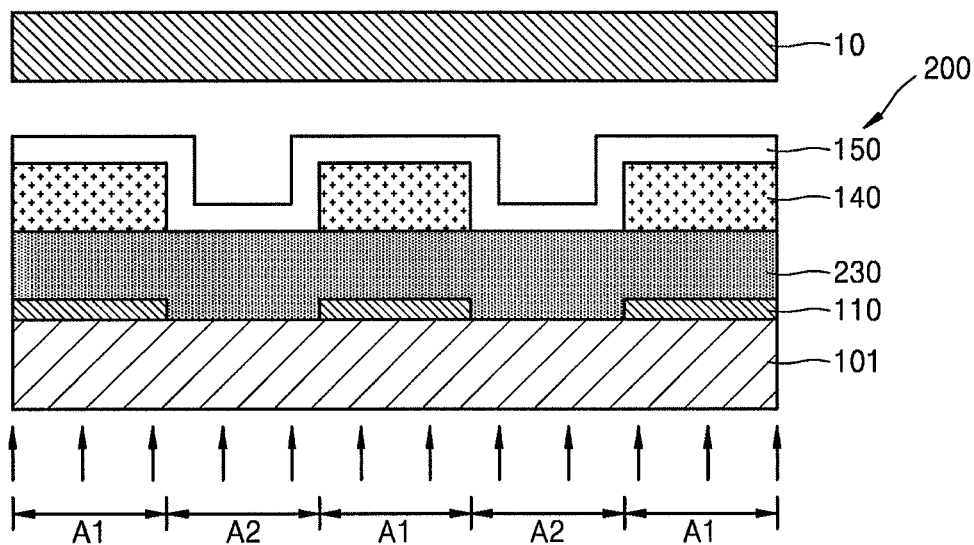
FIGS. 5 and 6 illustrate schematic cross-sectional views for describing stages of a method of forming a patterned transfer layer on the device substrate by using the optical pattern transfer mask of FIG. 4.
Figure 6:
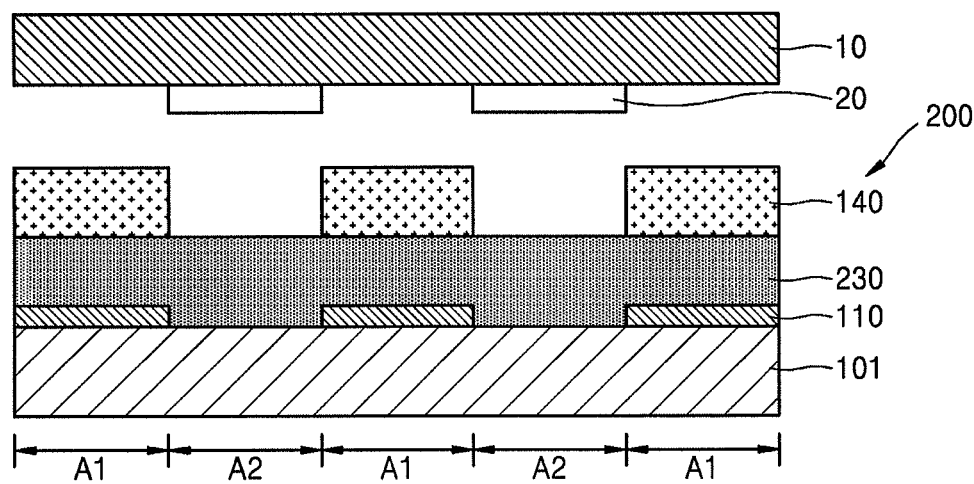

FIGS. 5 and 6 illustrate schematic cross-sectional views for describing stages of a method of forming a patterned transfer layer on the device substrate 10 by using the optical pattern transfer mask 200 of FIG. 4.

Referring to FIGS. 5 and 6, the transfer layer 150 of the optical pattern transfer mask 200 may be transferred to the device substrate 10 by aligning the optical pattern transfer mask 200 and the device substrate 10 and projecting light onto the back surface of the optical pattern transfer mask 200, thereby forming the transfer layer pattern 20 as described above with reference to FIGS. 2 and 3.

FIGS. 7A to 7D illustrate cross-sectional views for sequentially describing stages of a method of fabricating the optical pattern transfer mask 100 of FIG. 1.

Figure 7A:
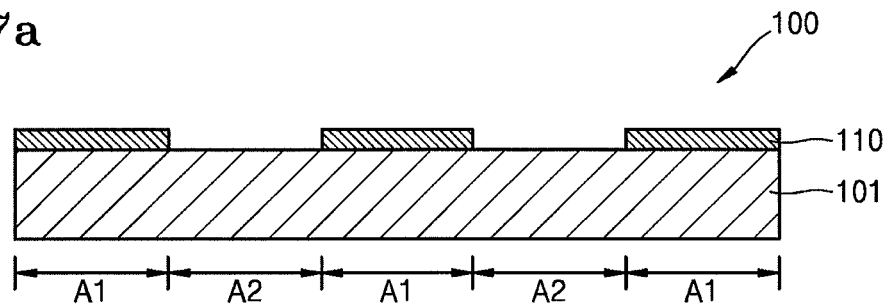
FIGS. 7A to 7D illustrate cross-sectional views for sequentially describing stages of a method of fabricating the optical pattern transfer mask of FIG. 1.

Referring to FIG. 7A, the reflection layer pattern 110 may be formed on the light transmissive substrate 101. The light transmissive substrate 101 may be formed of a suitable light transmittable material. For example, the light transmissive substrate 101 may be formed of a glass material or a heat resistant plastic material. The light transmissive substrate 101 has a plurality of first regions A1 and a second region A2 between the first regions A1.

The reflection layer pattern 110 may be formed on the light transmissive substrate 101 to correspond to the plurality of first regions A1. The reflection layer pattern 110 may be formed of a metal having a high reflectance, such as Ag, Al, Pt, Pd, Au, Ni, Nd, or Ir. The reflection layer pattern 110 may be formed by forming a layer by sputtering, vacuum deposition, or the like, and forming a pattern by lithography, or the like. The reflection layer pattern 110 may have a thickness of, for example, about 50 nm to about 500 nm.

Figure 7B:
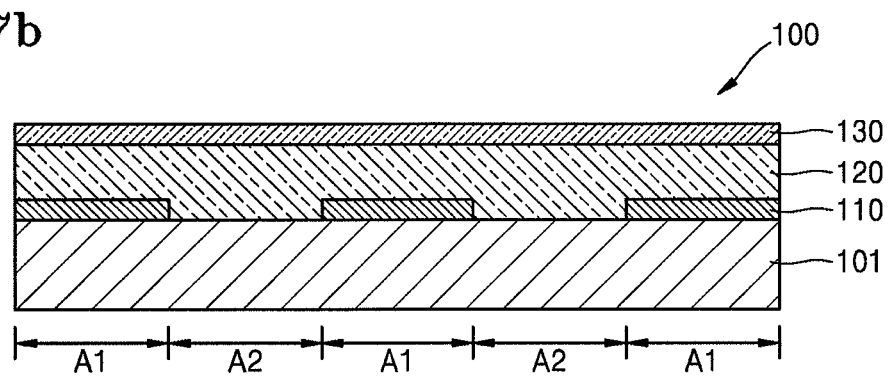

Referring to FIG. 7B, the heat insulation layer 120 may be formed on the light transmissive substrate 101 and the reflection layer pattern 110. The heat insulation layer 120 may be formed of a heat resistant polymer or an inorganic material, as described above with reference to FIG. 1. The heat insulation layer 120 may be formed by a general solution coating method such as spin coating and bar coating or deposition. For example, the heat insulation layer 120 may have a thickness of about 500 nm to about 3 μm.

The light absorbing layer 130 may be formed on the heat insulation layer 120 to cover the entire surface of the light transmissive substrate 101. The light absorbing layer 130 may have a single-layered structure including carbon or metal or a multi-layered structure in which metal layers and metal oxide layers are alternately stacked.

When the light absorbing layer 130 includes a metal, the metal may include Mo, Cr, Ti, or W. When the light absorbing layer 130 includes, for example, a metal oxide, the metal oxide may include ITO and $SiO_2$. For example, the light absorbing layer 130 may have a metal/metal oxide/metal stack structure.

Figure 7C:
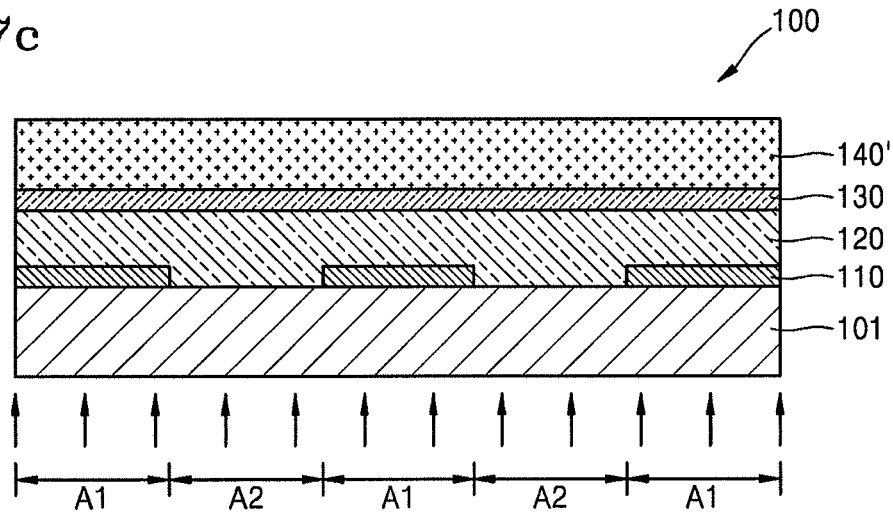

Referring to FIG. 7C, a bank layer 140' may be formed on the light absorbing layer 130. The bank layer 140' may be formed of a Diels-Alder polymer that may be polymerizable or depolymerizable by reversible Diels-Alder reaction.

For example, the bank layer 140' may be formed of a polyphthalaldehyde (PPA) polymer, or a polymer of a bis (maleimide) derivative cross-linked by trioxysilane.

The PPA polymer may be represented by Formula 1 below.

Formula 1

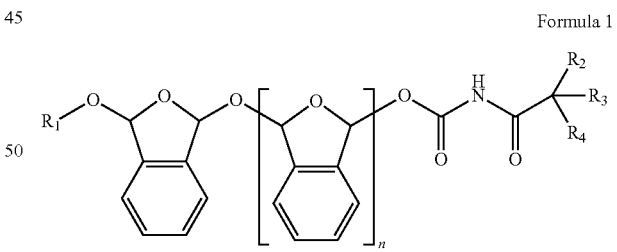

In Formula 1, $R_1$ is a hydrogen atom, a $C_1$-$C_{10}$ alkyl group, or a $C_6$-$C_{20}$ aryl group, and $R_2$ to $R_4$ are each independently a hydrogen atom, a halogen atom, or a $C_1$-$C_{10}$ alkyl group.

In Formula 1, n may be an integer equal to or greater than 10.

The polymer represented by Formula 1 may have a molecular weight (number average molecular weight) of about 2,000 to about 4,000.

The polymer of a bis(maleimide) derivative cross-linked by trioxysilane may be represented by Formula 2 below. The polymer represented by Formula 2 may have a molecular weight of about 2,000 to about 4,000.

Formula 2

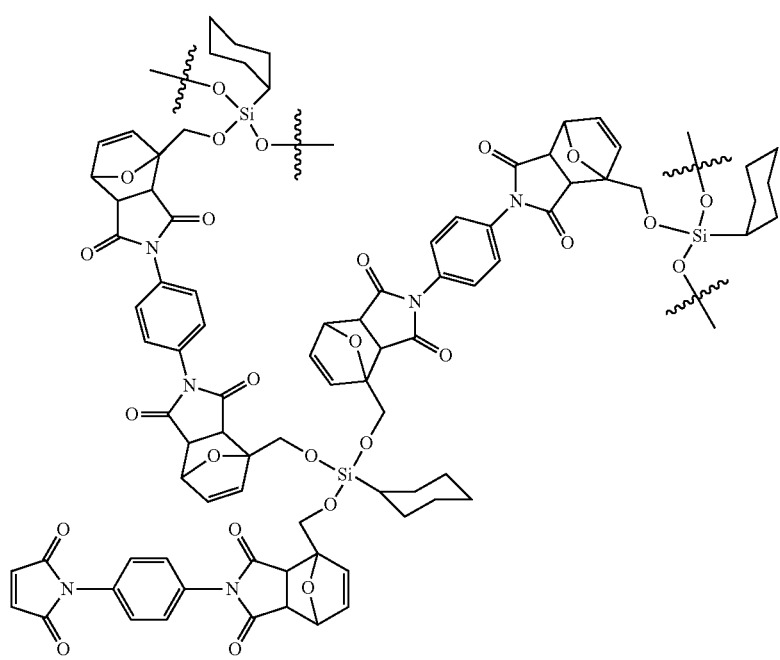

The bank layer 140' may be formed, for example, by applying a coating on the light absorbing layer 130 including a composition in which monomers capable of forming the Diels-Alder polymer are dissolved or dispersed, and polymerizing the monomers by the Diels-Alder reaction while heating the applied composition.

When phthalate is used as a monomer, a Diels-Alder polymer represented by Formula 1a below may be formed through a reaction scheme below. In this regard, a heating temperature may be in a range of about 100° C. to about 250° C. In the following reaction scheme, TCAI is trichloroacetyl isocyanate.

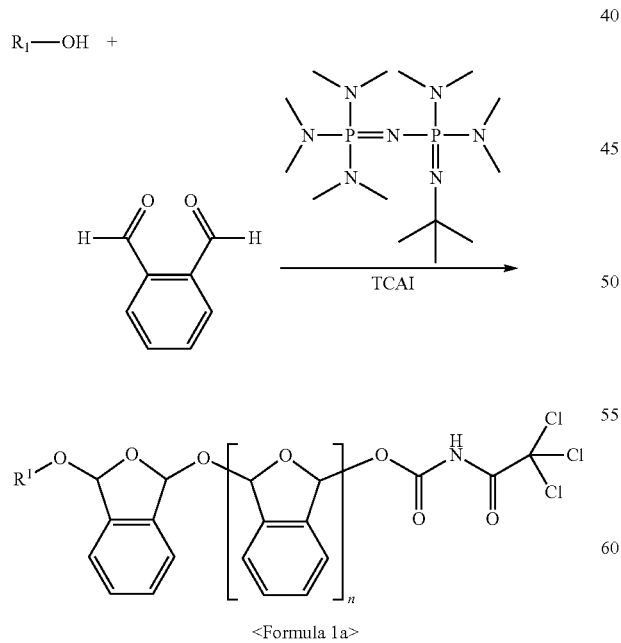

<Formula 1a>

In other implementations, compounds represented by Formulae 2-1 and 2-2 below may be used as a monomer:

Formula 2-1

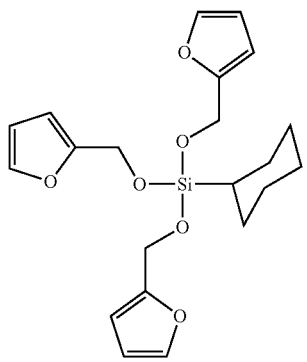

Formula 2-2

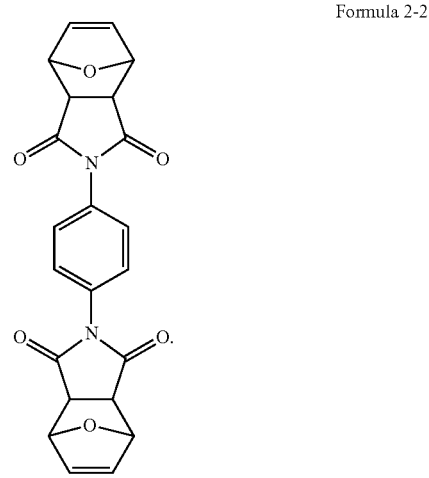

When compounds represented by Formula 2-1 and Formula 2-2 are used as monomers, a Diels-Alder polymer represented by Formula 2 may be formed through a reaction scheme shown below. A heating temperature may be in a range of about 100° C. to about 250° C.

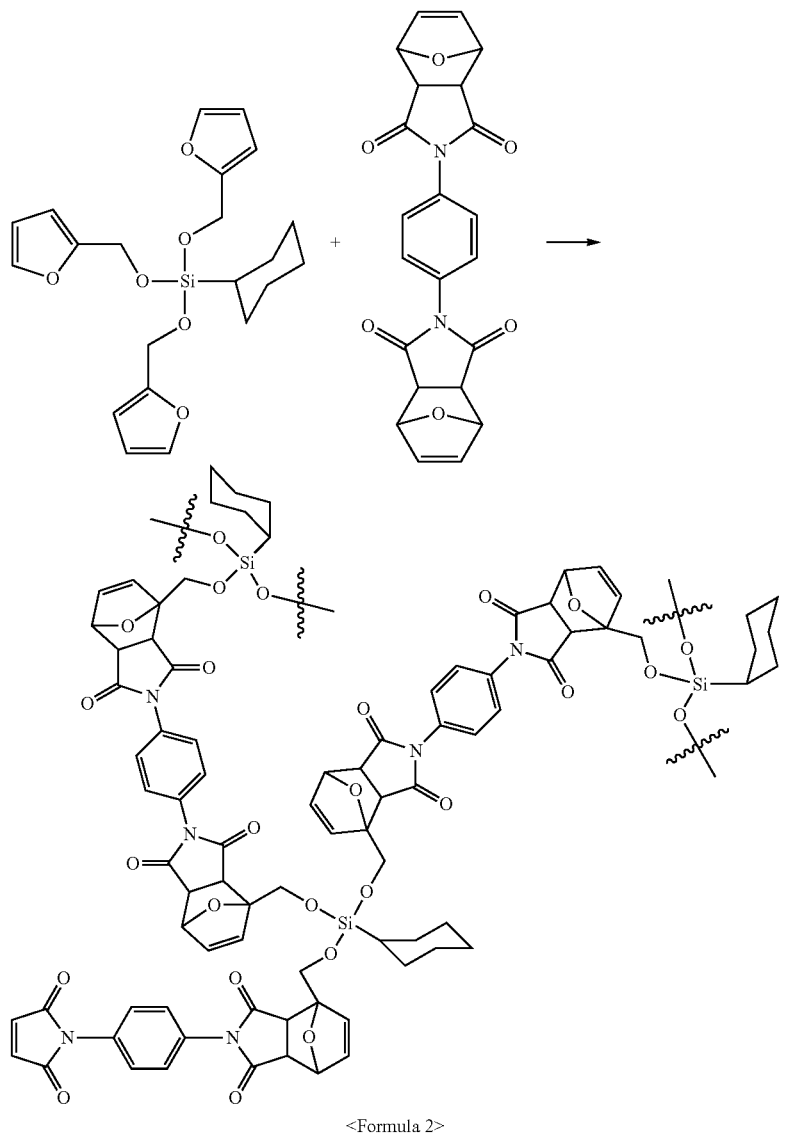

<Formula 2>

Then, light may be projected onto the back surface of the light transmissive substrate 101. The light may be flash lamp light, laser light, or LED light. The light may be projected such that a temperature of the bank layer 140' is greater than a depolymerization temperature of the Diels-Alder polymer.

When the light is projected, portions of the light absorbing layer 130 corresponding to the second regions A2 exposed through the reflection layer pattern 110 may absorb the light, thereby generating heat. The bank layer 140' may be heated by the generated heat in the second regions A2, and thus a reverse Diels-Alder reaction may occur. The polymer in the second regions A2 may be removed by depolymerization and decomposition into small molecules. The decomposed small molecules in a gas state may be removed by a vacuum pump or the like.

The polymer of the bank layer 140' in the first regions A1 is not heated. Accordingly, the reverse Diels-Alder reaction does not occur in the first regions A1, and thus the polymer in the first regions A1 may not be depolymerized but may remain thereon.

Figure 7D:
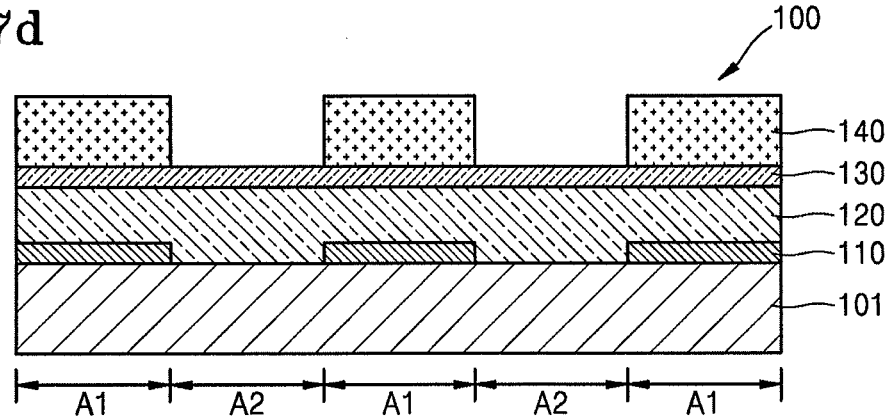

Referring to FIG. 7D, after the light projection, the polymer of the bank layer 140' remains in the first regions A1 and is removed from the second regions A2 where the bank layer pattern 140 is formed.

FIGS. 8A to 8D illustrate cross-sectional views for sequentially describing a method of fabricating the optical pattern transfer mask 200 of FIG. 4.

The method of fabricating the optical pattern transfer mask 200 may be the same as that of fabricating the optical pattern transfer mask 100 described above with reference to FIGS. 7A to 7D, except that the heat insulation layer 120 is not formed. Hereinafter, the present embodiment will be described based on differences from the method of fabricating the optical pattern transfer mask described above with reference to FIGS. 7A to 7D.

Figure 8A:
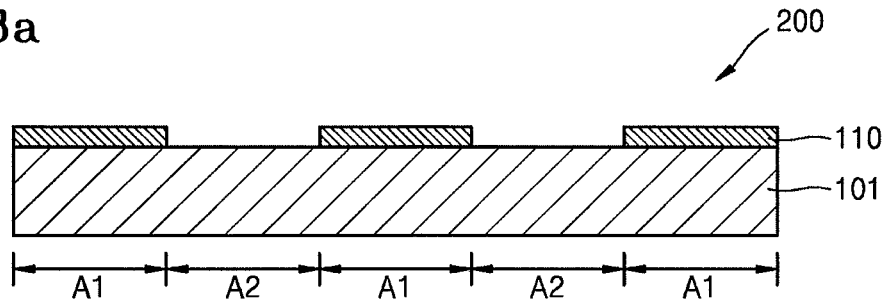
FIGS. 8A to 8D illustrate cross-sectional views for sequentially describing stages of a method of fabricating the optical pattern transfer mask of FIG. 4.

Referring to FIG. 8A, the reflection layer pattern 110 may be formed on the light transmissive substrate 101. Formation of the light transmissive substrate 101 and the reflection layer pattern 110 is described above with reference to FIG. 7A.

Figure 8B:
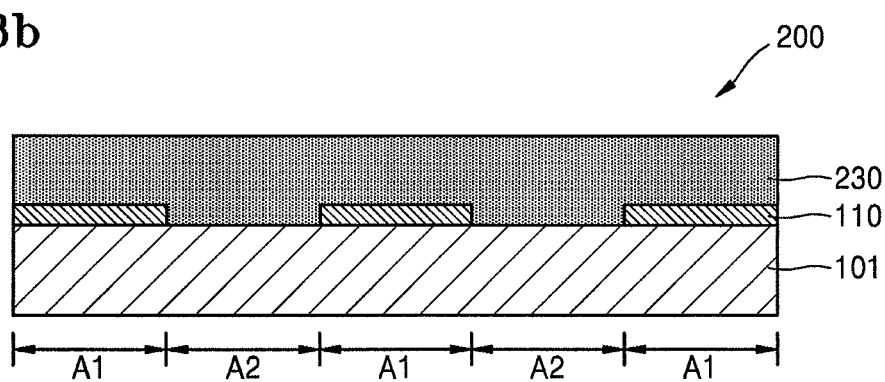

Referring to FIG. 8B, a light absorbing layer 230 may be formed on the light transmissive substrate 101 and the reflection layer pattern 110. In this regard, the light absorbing layer 230 may have a single-layered structure including carbon or metal or a multi-layered structure in which metal layers and metal oxide layers are alternately stacked in the same manner as in the light absorbing layer 130 described above with reference to FIG. 7B. The light absorbing layer 230 may have a thickness of about 100 μm to about 500 μm.

Figure 8C:
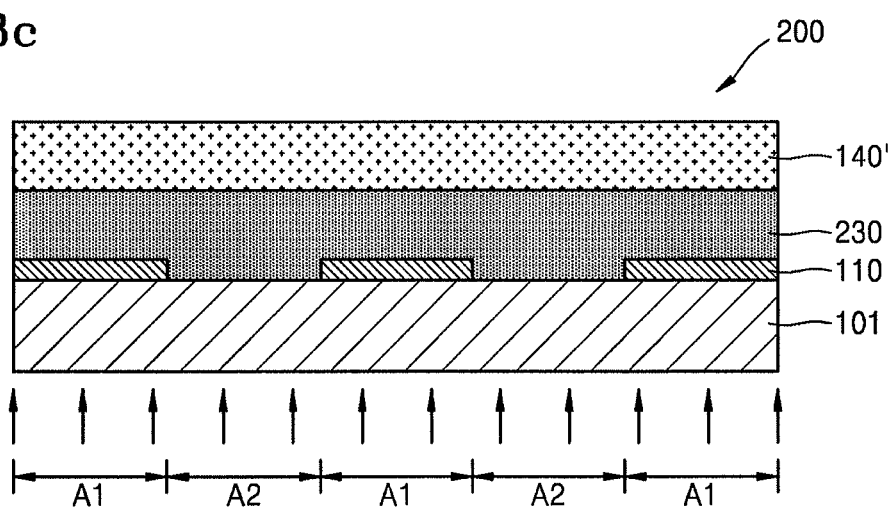

Referring to FIG. 8C, the bank layer 140' may be formed on the light absorbing layer 230. Formation of the bank layer 140' is described above with reference to FIG. 7C.

Figure 8D:
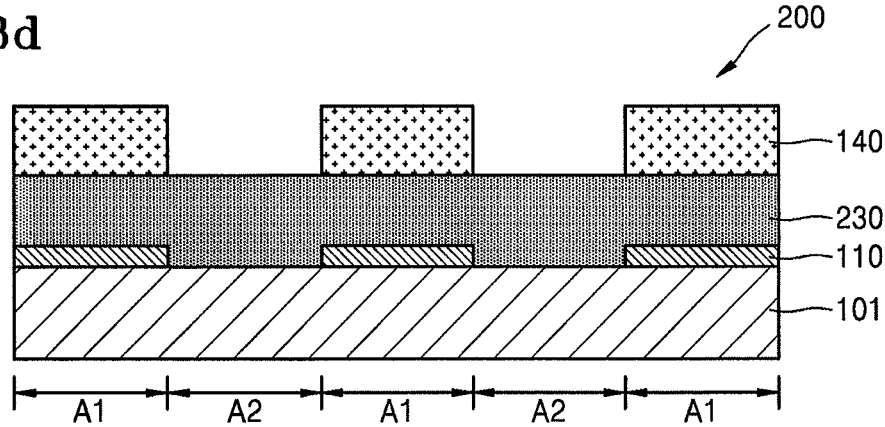

Referring to FIG. 8D and the above description relating to FIGS. 7C and 7D, after light is projected onto the back surface of the light transmissive substrate 101, the polymer of the bank layer 140' remains in the first regions A1 and is removed in the second regions A2, thereby forming the bank layer pattern 140.

Figure 9:
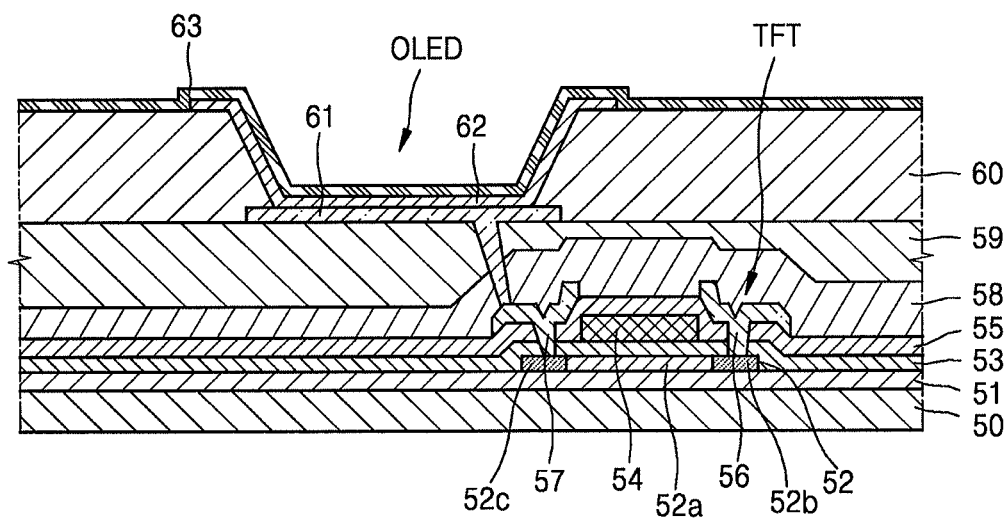
FIG. 9 illustrates a schematic cross-sectional view of an organic light-emitting display apparatus fabricated using any one of the optical pattern transfer masks of FIGS. 1 and 4.

FIG. 9 illustrates a schematic cross-sectional view of an organic light-emitting display apparatus fabricated using any one of the optical pattern transfer masks of FIGS. 1 and 4.

Referring to FIG. 9, various constituent elements of the organic light-emitting display apparatus may be formed on a substrate 50. In this regard, the substrate 50 may be the device substrate 10 described above with reference to FIG. 2 or a cut portion of the device substrate 10. The substrate 50 may be formed of a transparent material such as a glass material, a plastic material, or a metallic material.

A common layer, such as a buffer layer 51, a gate insulating layer 53, or an interlayer insulating layer 55, may be formed on the entire surface of the substrate 50. Also, a patterned semiconductor layer 52 including a channel region 52a, a source contact region 52b, and a drain contact region 52c may be formed, and a gate electrode 54, a source electrode 56, and a drain electrode 57 constituting a thin film transistor (TFT) may be formed together with the patterned semiconductor layer 52.

In addition, a passivation layer 58 to cover the TFT and a planarization layer 59 disposed on the passivation layer 58 and having a planar upper surface may be formed on the entire surface of the substrate 50. An organic light-emitting device (OLED), which includes a patterned pixel electrode 61, an opposite electrode 63 corresponding to almost the entire surface of the substrate 50, and a multi-layered intermediate layer 62 interposed between the pixel electrode 61 and the opposite electrode 63 and including an emission layer, may be formed on the planarization layer 59. In some implementations, the intermediate layer 62 may include a common layer corresponding to almost the entire surface of the substrate and a pattern layer patterned to corresponding to the pixel electrode 61. The pixel electrode 61 may be electrically connected to the TFT. In some implementations, a pixel defining layer 60 that covers edges of the pixel electrode 62 and includes openings defining each pixel region, may be formed to correspond to almost the entire surface of the substrate 50.

In the organic light-emitting display apparatus, at least some of the constituent elements may be formed using the optical pattern transfer mask according to exemplary embodiments.

For example, the intermediate layer 62 may be formed using the optical pattern transfer mask according to exemplary embodiments. As examples, a hole injection layer (HIL), a hole transport layer (HTL), an emission layer (EML), an electron transport layer (ETL), an electron injection layer (EIL), or the like included in the intermediate layer 62 may be formed according to the method according to exemplary embodiments. The optical pattern transfer mask according to exemplary embodiments may also be used to form another pattern layer.

An optical pattern transfer mask has been described above. In other implementations, other transfer methods such as one using a photo-thermal conversion transfer mask may be used. Such transfer methods include aligning an optical pattern transfer mask and a substrate onto which a layer is transferred, and forming a transfer layer patterned to correspond to regions between a plurality of first regions of the optical pattern transfer mask on the substrate by projecting light onto the optical pattern transfer mask as described above.

Also, as described above, according to the one or more of the above exemplary embodiments, the bank layer pattern may be formed by back exposure by using the reflection layer pattern as an exposure mask. Thus, the bank layer pattern may be formed by a simple process with low manufacturing costs without performing photolithography.

By way of summation and review, when an organic light-emitting display apparatus is fabricated, the emission layer may be manufactured using various methods, such as a transfer printing process or inkjet printing.

In the transfer printing process, a bank pattern may be used to prevent an undesired transfer of a pattern, which is used for transferring a transfer material from the optical pattern transfer mask, onto an unintended transfer region of a device substrate. Although the bank pattern may be formed by photolithography after forming an inorganic layer, photolithography is a complicated and expensive process.

Embodiments provide an optical pattern transfer mask including a bank pattern formed by using a simple process with low manufacturing costs and methods of fabricating the optical pattern transfer masks.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An optical pattern transfer mask, comprising:
   a light transmissive substrate;
   a reflection layer pattern on a plurality of first regions of the light transmissive substrate;
   a light absorbing layer on the light transmissive substrate and the reflection layer pattern; and
   a bank layer pattern on the light absorbing layer corresponding to the plurality of first regions of the light transmissive substrate, the bank layer pattern being vertically aligned with the reflection layer pattern,
   wherein the bank layer pattern includes a Diels-Alder polymer that is polymerizable and depolymerizable by a reversible Diels-Alder reaction.

2. The optical pattern transfer mask as claimed in claim 1, wherein the Diels-Alder polymer includes a polyphthalaldehyde (PPA) polymer, or a polymer of a bis(maleimide) derivative cross-linked by trioxysilane.

3. The optical pattern transfer mask as claimed in claim 1, wherein the Diels-Alder polymer includes a polymer represented by Formula 1 or 2 below:

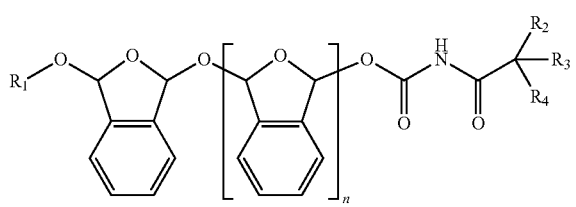

Formula 1

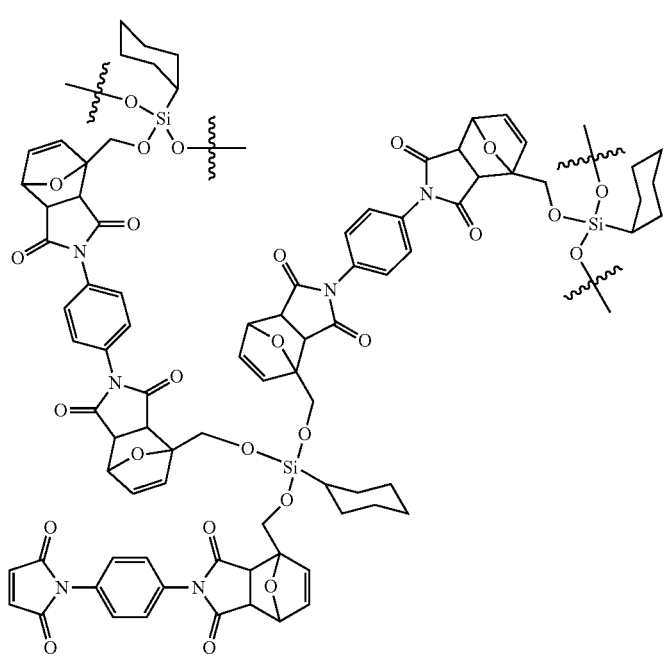

Formula 2 wherein, in Formula 1, $R_1$ is a hydrogen atom, a $C_1$-$C_{10}$ alkyl group, or a $C_6$-$C_{20}$ aryl group, $R_2$ to $R_4$ are each independently a hydrogen atom, a halogen atom, or a $C_1$-$C_{10}$ alkyl group, and n is an integer equal to or greater than 10 and equal to or less than 1,000.

4. The optical pattern transfer mask as claimed in claim 1, further comprising a transfer layer on the bank layer pattern.

5. The optical pattern transfer mask as claimed in claim 1, further comprising a heat insulation layer between the reflection layer pattern and the light absorbing layer.

6. A method of fabricating an optical pattern transfer mask, the method comprising:
   providing a light transmissive substrate;
   forming a reflection layer pattern on a plurality of first regions of the light transmissive substrate, the reflection layer pattern defining openings at second regions between the first regions;
   forming a light absorbing layer on the light transmissive substrate and the reflection layer pattern;
   forming a bank layer on the light absorbing layer, the bank layer including a Diels-Alder polymer that is polymerizable and depolymerizable by a reversible Diels-Alder reaction; and
   removing the Diels-Alder polymer of the bank layer in the second regions via depolymerization by projecting light onto the bottom surface of the light transmissive substrate.

7. The method as claimed in claim 6, wherein forming the bank layer includes:

applying, on the light absorbing layer, a composition in which monomers polymerizable to form the Diels-Alder polymer are mixed; and
preparing the Diels-Alder polymer from the monomers via the Diels-Alder reaction by heating the applied composition.

8. The method as claimed in claim 7, wherein the monomers include phthalate.

9. The method as claimed in claim 7, wherein the monomers include compounds represented by Formulae 2-1 and 2-2 below:

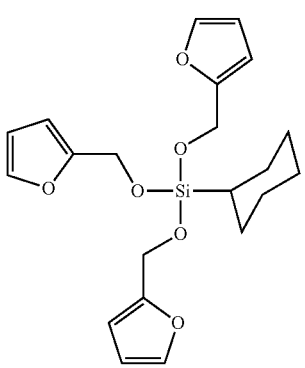

Formula 2-1

Formula 2-2

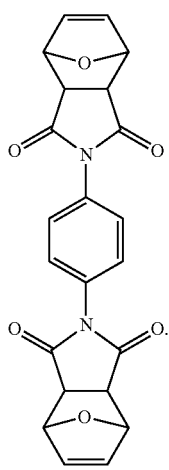

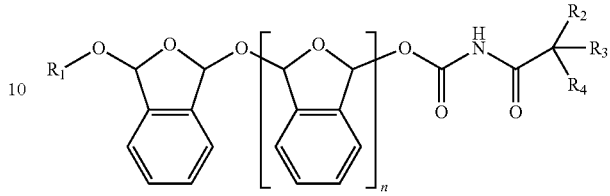

Formula 1 wherein $R_1$ is a hydrogen atom, a $C_1$-$C_{10}$ alkyl group, or a $C_6$-$C_{20}$ aryl group, $R_2$ to $R_4$ are each independently a hydrogen atom, a halogen atom, or a $C_1$-$C_{10}$ alkyl group, and n is an integer equal to or greater than 10 and equal to or less than 1,000.

10. The method as claimed in claim 6, wherein the Diels-Alder polymer includes a polyphthalaldehyde (PPA) polymer, or a polymer of a bis(maleimide) derivative cross-linked by trioxysilane.

11. The method as claimed in claim 6, wherein the Diels-Alder polymer includes a polymer represented by Formula 1 below:

12. The method as claimed in claim 6, wherein the Diels-Alder polymer includes a polymer represented by Formula 2 below:

Formula 2

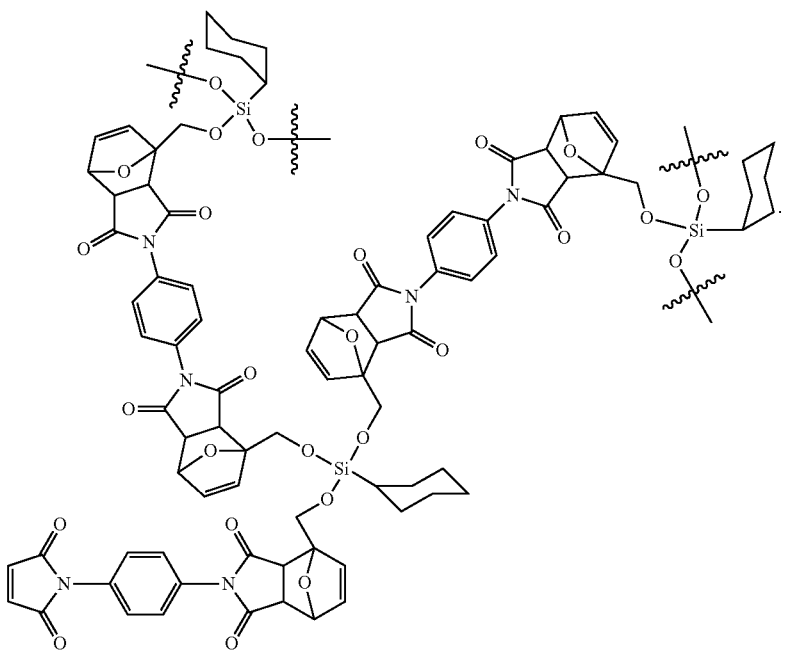

13. The method as claimed in claim 6, further comprising forming a transfer layer on the bank layer pattern.

14. The method as claimed in claim 6, further comprising forming a heat insulating layer between the reflection layer pattern and the light absorbing layer.

15. The method as claimed in claim 6, wherein the light absorbing layer includes a metal layer or a stack structure in which metal layers and metal oxide layers are alternately stacked.

16. The method as claimed in claim 6, wherein the light absorbing layer absorbs the light and converts the light into heat.

17. The method as claimed in claim 6, wherein the light is flash lamp light, laser light, or light-emitting diode (LED) light.

18. The method as claimed in claim 6, wherein the light is projected to increase a temperature of the bank layer in the second regions to be greater than a depolymerization temperature of the Diels-Alder polymer.

\* \* \* \* \*